United States Patent [19]
Hausmann

[11] Patent Number: 5,886,866
[45] Date of Patent: Mar. 23, 1999

[54] ELECTROSTATIC CHUCK HAVING A COMBINATION ELECTRODE STRUCTURE FOR SUBSTRATE CHUCKING, HEATING AND BIASING

[75] Inventor: Gilbert Hausmann, Santa Clara, Calif.

[73] Assignee: Applied Materials, Inc., Santa Clara, Calif.

[21] Appl. No.: 111,104

[22] Filed: Jul. 6, 1998

[51] Int. Cl.$^6$ ................................................ H02N 13/00
[52] U.S. Cl. ........................................ 361/234; 279/128
[58] Field of Search ................................ 361/230–235; 279/128

[56] References Cited

U.S. PATENT DOCUMENTS

| | | | |
|---|---|---|---|
| 4,502,094 | 2/1985 | Lewin et al. | 361/234 |
| 5,166,856 | 11/1992 | Liporace et al. | 361/233 |
| 5,191,506 | 3/1993 | Logan et al. | 361/234 |
| 5,280,156 | 1/1994 | Niori et al. | 361/234 |
| 5,567,267 | 10/1996 | Kazama et al. | 156/345 |
| 5,581,874 | 12/1996 | Aoki et al. | 361/234 |
| 5,584,971 | 12/1996 | Komino | 204/192.13 |
| 5,606,484 | 2/1997 | Kawada et al. | 361/234 |
| 5,663,865 | 9/1997 | Kawada et al. | 361/234 |
| 5,665,260 | 9/1997 | Kawada et al. | 361/233 |
| 5,671,116 | 9/1997 | Husain | 361/234 |
| 5,708,250 | 1/1998 | Benjamin et al. | 361/234 |
| 5,708,556 | 1/1998 | Van Os et al. | 361/234 |
| 5,737,175 | 4/1998 | Grosshart et al. | 361/234 |
| 5,737,178 | 4/1998 | Herchen | 361/234 |

*Primary Examiner*—Fritz Fleming
*Attorney, Agent, or Firm*—Thomason & Moser

[57] ABSTRACT

An electrostatic chuck including a body of ceramic material, a pair of electrodes embedded in the body of ceramic material, and two feedthroughs connected to each of the electrodes for receiving DC chucking voltage, RF biasing power, and electric heating current. The electrode structure simultaneously provides biasing, chucking and heating of a wafer that is retained by the chuck.

24 Claims, 5 Drawing Sheets

ELECTROSTATIC CHUCK HAVING A COMBINATION ELECTRODE STRUCTURE FOR SUBSTRATE CHUCKING, HEATING AND BIASING

BACKGROUND OF THE INVENTION

1. Field of the Invention

This invention relates generally to an electrostatic chuck and, more particularly, this invention relates to an electrostatic chuck containing electrodes that are used for chucking a substrate, biasing a substrate and heating a substrate.

2. Description of the Background Art

Electrostatic chucks are known for electrostatically attracting and retaining a substrate such as a semiconductor wafer during wafer processing such as, for example, by physical vapor deposition (PVD), chemical vapor deposition (CVD) and etching. An example of the structure and function of an electrostatic chuck is set forth in U.S. Pat. No. 5,117,121, entitled METHOD OF AND APPARATUS FOR APPLYING A VOLTAGE TO ELECTROSTATIC CHUCK, patented May 26, 1992, Watanabe et al. inventors; this patent is incorporated herein by reference. As taught in this incorporated patent, a pair of electrodes is embedded in a sheet of relatively low resistivity ceramic material, and DC voltage is applied to the electrodes to create an electric field. When a semiconductor wafer is placed on the chuck, the electric field causes charges to accumulate on the backside of the wafer and opposite charges migrate to the surface of the chuck that is supporting the wafer. The oppositely charged surfaces electrostatically attract the semiconductor wafer to the chuck according to the Johnsen-Rahbek effect. Other known electrostatic chucks embed a pair of electrodes in a body of dielectric material to electrostatically attract a semiconductor wafer utilizing a Coulombic effect, i.e., the charges on the backside of the wafer and those on the electrodes attract one another.

In PVD chambers, the electrostatic chuck is typically mounted to a pedestal that is centrally located in the chamber. To RF bias the wafer, RF power is coupled directly to the pedestal, i.e., the pedestal forms a cathode electrode, and the RF power is coupled indirectly through the electrostatic chuck to the semiconductor wafer. As such, RF power losses are experienced due to the indirect coupling of the RF power through the chuck to the semiconductor wafer.

In certain semiconductor wafer processing applications, such as the PVD deposition of titanium on a semiconductor wafer, the semiconductor wafer is advantageously heated to enhance the adhesion of the deposited titanium to the wafer. Typically, a resistive heater is used to supply heat to the wafer. The heater is generally a resistive coil embedded in the ceramic material of the electrostatic chuck, or the heater may be embedded in a plate of stainless steel that is attached to the bottom of the electrostatic chuck. In either case, the heat produced by the heater must couple through the chuck material and the chuck electrode material before reaching the wafer. Such heating from the bottom of the chuck can produce a substantial thermal gradient vertically across the chuck. Furthermore, non-uniform thermal coupling through chuck can produce non-uniform heating of the wafer that results in non-uniform deposition characteristics.

Accordingly, there is a need in the art for an electrostatic chuck with fewer component parts than prior electrostatic chucks and which provides for DC voltage biasing for electrostatic chucking, RF power biasing and semiconductor wafer heating using a single electrode structure.

SUMMARY OF THE INVENTION

The disadvantages associated with the prior art are overcome by an electrostatic chuck including a body of ceramic material, a pair of electrodes embedded in the body of ceramic material, and two feedthroughs connected to each of the electrodes for receiving DC chucking voltage, RF biasing power, and electric heating current. As such, the invention uses a single pair of electrodes for biasing, chucking and heating a wafer. Consequently, a semiconductor wafer processing system incorporating the invention will have a simplified pedestal assembly and a wafer supported by the inventive chuck will experience more uniform processing.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE PREFERRED EMBODIMENT

Figure 1:
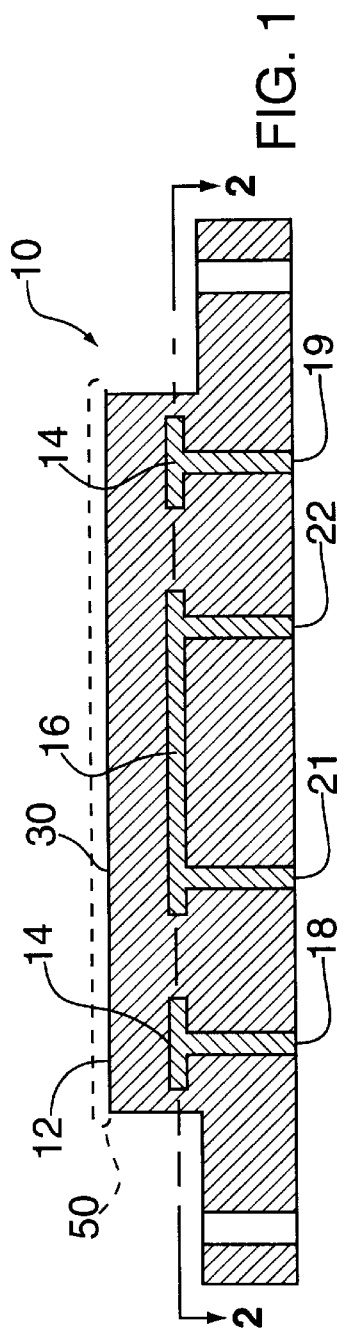
FIG. 1 depicts an elevational cross-sectional view of an electrostatic chuck embodying the present invention.
Figure 2:
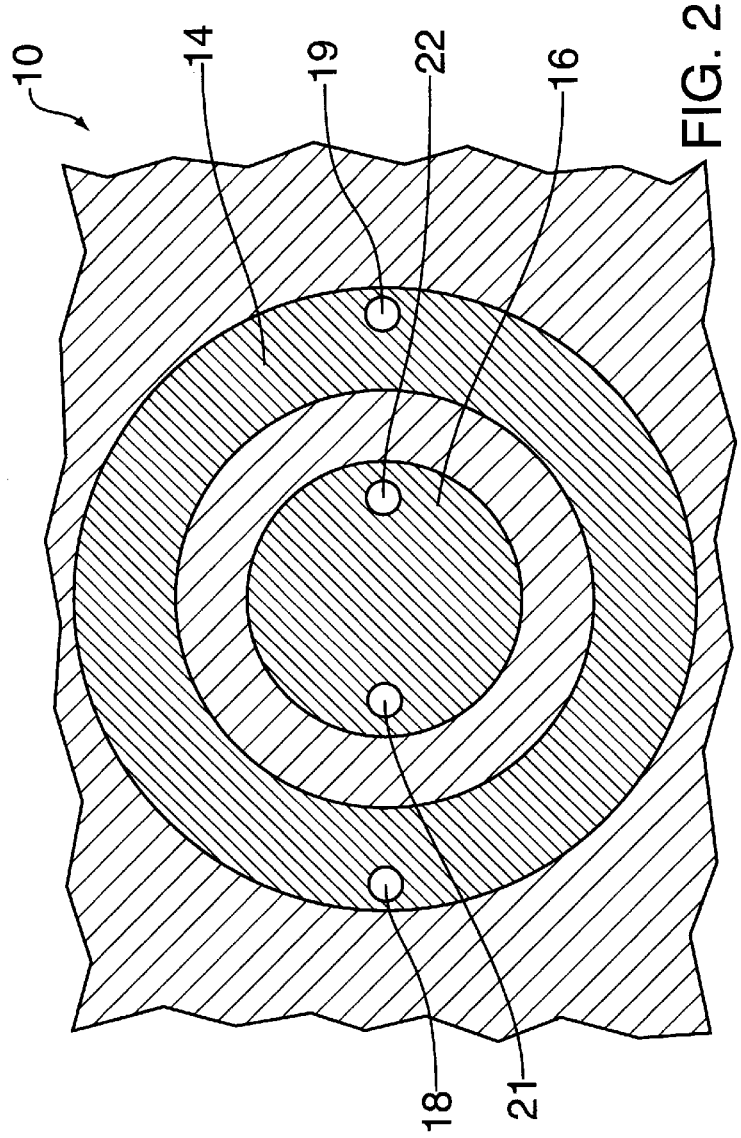
FIG. 2 depicts a horizontal cross-sectional view of the chuck taken generally along the line 2—2 in FIG. 1 in the direction of the arrows.

Referring now to FIGS. 1 and 2, there is shown an electrostatic chuck 10 embodying the present invention. The chuck 10 includes a body 12 of ceramic material having a pair of electrodes 14 and 16 embedded therein. The electrode 16 is an inner circular electrode, and the electrode 14 is an outer annular electrode concentric with and spaced apart from the inner electrode 16. The two electrodes 14 and 16 are generally horizontally coplanar. Two electrical connectors or feedthroughs 18 and 19 are formed integrally with the outer annular electrode 14 and two electrical connectors or feedthroughs 21 and 22 are formed integrally with the inner circular electrode 16. The body 12 of ceramic material and the electrodes 14 and 16 and feedthroughs 18, 19, 21 and 22 have substantially the same coefficient of expansion. For example, the body 12 of ceramic material may be aluminum-nitride having a coefficient of expansion of about $4.4 \times 10^{-6}/K°$, and the electrodes 14 and 16 and the feedthroughs 18, 19, 21 and 22 may be, for example, molybdenum having a coefficient of expansion of about $5.2 \times 10^{-6}/K°$. Each electrode 14 and 16 is generally a solid plate having a thickness of between 10 and 500 $\mu$m. To facilitate heat generation, molybdenum has a resistance of 5.4 $\mu\Omega$-cm and the resistivity changes very little with temperature, i.e., 0.47%/K°. Other materials such as titanium or tungsten would also operate well as electrode material. The feedthrough connectors are also fabricated of molybdenum, titanium or tungsten and have a diameter of about 0.1 to 0.5 inches (0.25 to 1.25 cm).

Figure 3:
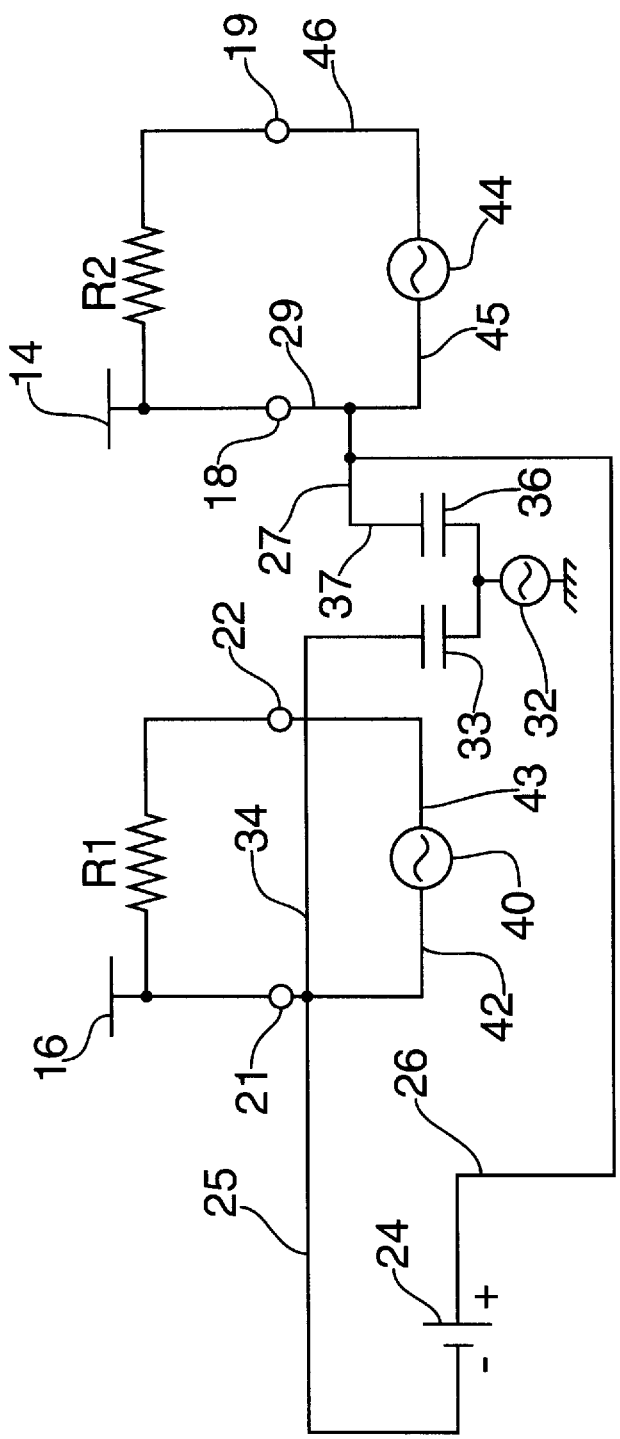
FIG. 3 depicts an electrical schematic showing the connections of the DC voltage, RF power supply and heating current supply to the electrostatic chuck electrodes.

FIG. 3 depicts a schematic of the electronics used to drive the electrodes 14 and 16 of the embodiment of the invention in FIG. 2. The outer annular electrode 14 is indicated diagrammatically by the element 14 and the inner circular electrode 16 is indicated diagrammatically by the element 16. The feedthroughs 18 and 19 for the electrode 14 are indicated diagrammatically by the circles 18 and 19, and the feedthroughs 21 and 22 for the electrode 16 are represented by the circles 21 and 22.

A suitable source of DC voltage 24 is connected by lead 25 to feedthrough 21 and thereby to the electrode 16, and is connected by lines 26, 27 and 29 to the feedthrough 18 and thereby to the electrode 14. The application of the DC voltage 24 to the feedthroughs 21 and 18 applies the DC voltage to the respective electrodes 16 and 14 to establish an electric field for electrostatically attracting and chucking a semiconductor wafer 50 to the top or support surface 30 (FIG. 1) of the electrostatic chuck 10.

RF power from a suitable RF power supply 32 is connected through capacitor 33, lead 34 to the feedthrough 21 and thereby to the electrode 16. In this manner, the RF power supply 32 applies RF biasing power to the inner circular electrode 16. Additionally, RF power from the RF power supply 32 is connected through capacitor 36, lead 37, lead 27 and lead 29 to the feedthrough 18 and thereby to the outer annular electrode 14 to apply RF biasing power to the outer annular electrode 14. The capacitors 33 and 36 are provided to prevent shorting the DC voltage supply 24. Alternatively, the RF power supply 36 could be connected to the electrodes 14 and 16 through feedthroughs 19 and 22 and through suitable capacitors and leads.

With regard to the application of heating current to the chuck 10 in FIG. 3, the resistor R1 represents the resistance of the electrode 16 and the resistor R2 represents the resistance of the electrode 14. A suitable heating current supply 40, generally an AC supply, is provided and is connected to the feedthroughs 21 and 22 of the inner circular electrode 16 by leads 42 and 43. The supply 40 applies heating current to the inner circular electrode 16 to heat the electrode and thereby heat a semiconductor wafer 50 residing on the top 30, FIG. 1, of the electrostatic chuck 10. Similarly, a suitable heating current supply 44, generally an AC supply, is provided and is connected to the feedthroughs 18 and 19 of the outer annular electrode 14 by leads 45 and 46. The supply 44 applies heating current to the electrode 14 (resistor R2) to heat the electrode and thereby heat the semiconductor wafer 50 chucked electrostatically to the top surface 30 (FIG. 1) of the electrostatic chuck 10. It will be understood that, depending upon heating current levels required, only one of the AC heating current supplies may be used and that when both supplies are used dual zone heating is possible, i.e., heating different portions of the wafer differing amounts.

It will be understood that the present invention also includes the electrostatic chuck of FIGS. 1 and 2 in combination with the electrical components depicted schematically in FIG. 3, namely, the DC voltage supply 24, RF power supply 32, one or both of the heating current supplies 40 and 44, capacitors 33 and 36 and the associated leads providing the interconnections described above.

Figure 4:
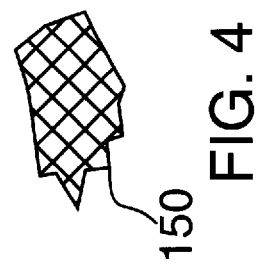
FIG. 4 depicts a partial view of alternative electrode structure, namely, a mesh or lattice electrode.

FIG. 4 depicts an alternative to the solid circular electrode 16 and outer annular electrode 14 shown in FIGS. 1 and 2. The alternative electrodes may be suitable metal lattice or mesh electrodes such as the mesh or lattice electrode 150 shown in FIG. 4. A mesh electrode more evenly distributes the DC voltage from the DC supply 24, the RF power from the RF supply 32 and heating current from one or more of the heating current supplies 40 and 44. As such, using a mesh electrode may result in more uniform wafer processing.

Figure 5:
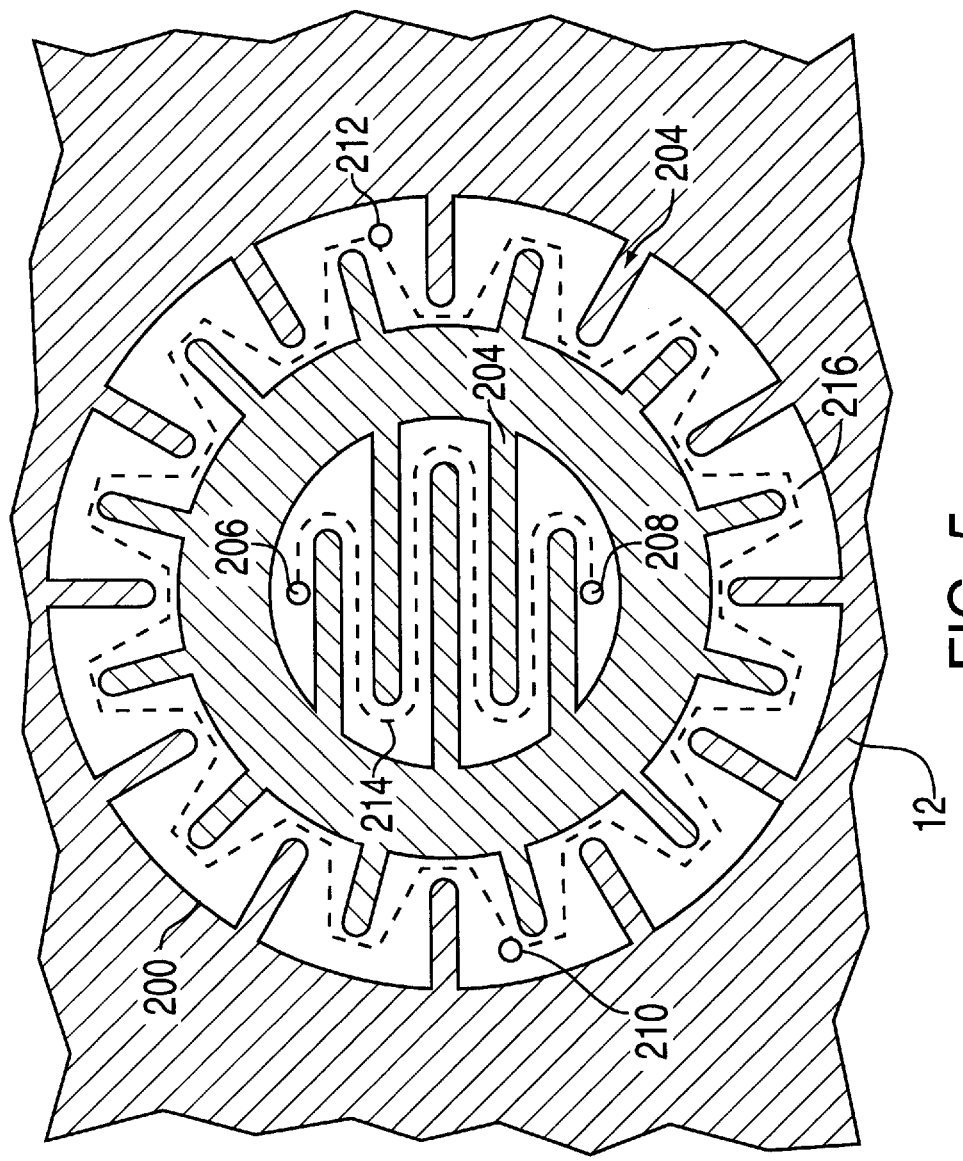
FIG. 5 depicts an elevational cross-sectional view of an electrostatic chuck of a horizontal cross-sectional view of the chuck in FIG. 2 containing cutout portions in the electrodes.

FIG. 5 depicts a top plan, cutaway view of an alternative arrangement of a pair of electrodes 200 and 202. These electrodes 200 and 202 have a similar plan form as electrodes 14 and 16 of FIG. 2 in that electrode 200 is an inner circular electrode, and electrode 202 is an outer annular electrode concentric with and spaced apart from the inner electrode 200. Each electrode 200 and 202 contains a plurality "cut out" portions 204, where each cut out portion extends partially across the electrode. The cut out portions alternate by extending alternately from each side edge of the electrode. As such, the current path from one feedthrough 206, 210 to another respective feedthrough 208, 212, is serpentine (as shown by the dotted lines 214 and 216). Such an extensive current path increases the heating capability of each electrode. The current paths can be shortened or lengthened relative to one another to provide tailored heat generation, i.e., to facilitate zonal heating. This bipolar electrode structure is driven using the same electronics as depicted in FIG. 3.

Figure 6:
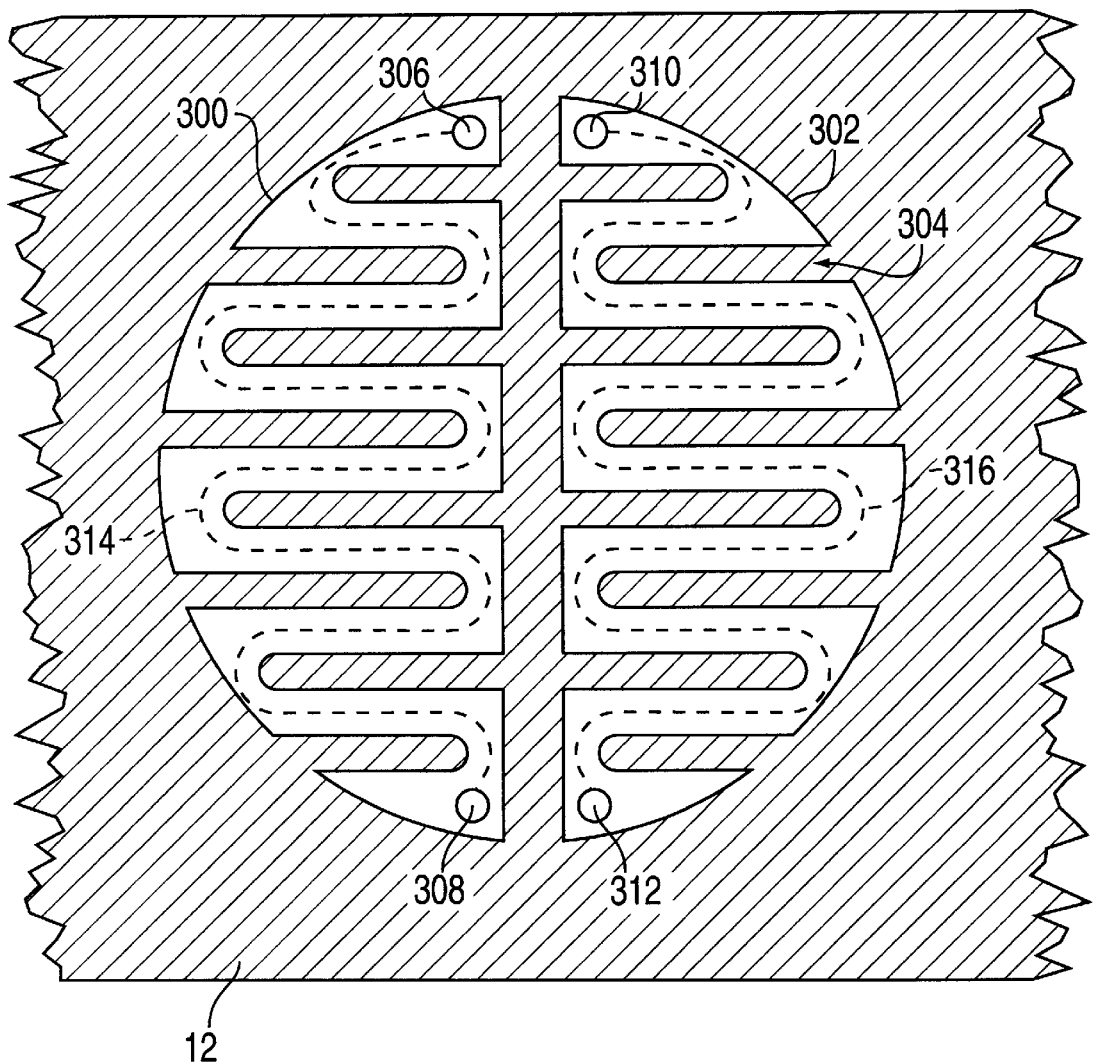
FIG. 6 depicts a horizontal cross-sectional view of an alternative electrode arrangement having half-moon shaped electrodes.

FIG. 6 depicts another alternative embodiment of the electrode structure of the present invention. In this embodiment, the pair of electrodes is arranged as two half-moon shaped electrodes 300 and 302. The electrodes 300 and 302 can be formed with cut out portions 304, as shown or solid electrodes (not shown). With cut out portions, the current from each respective feedthrough 306, 310 to its other respective feedthrough 308, 312 flows in a serpentine path 314, 316 through each electrode 300, 302. This bipolar electrode structure is driven using the same electronics as depicted in FIG. 3.

Figure 7:
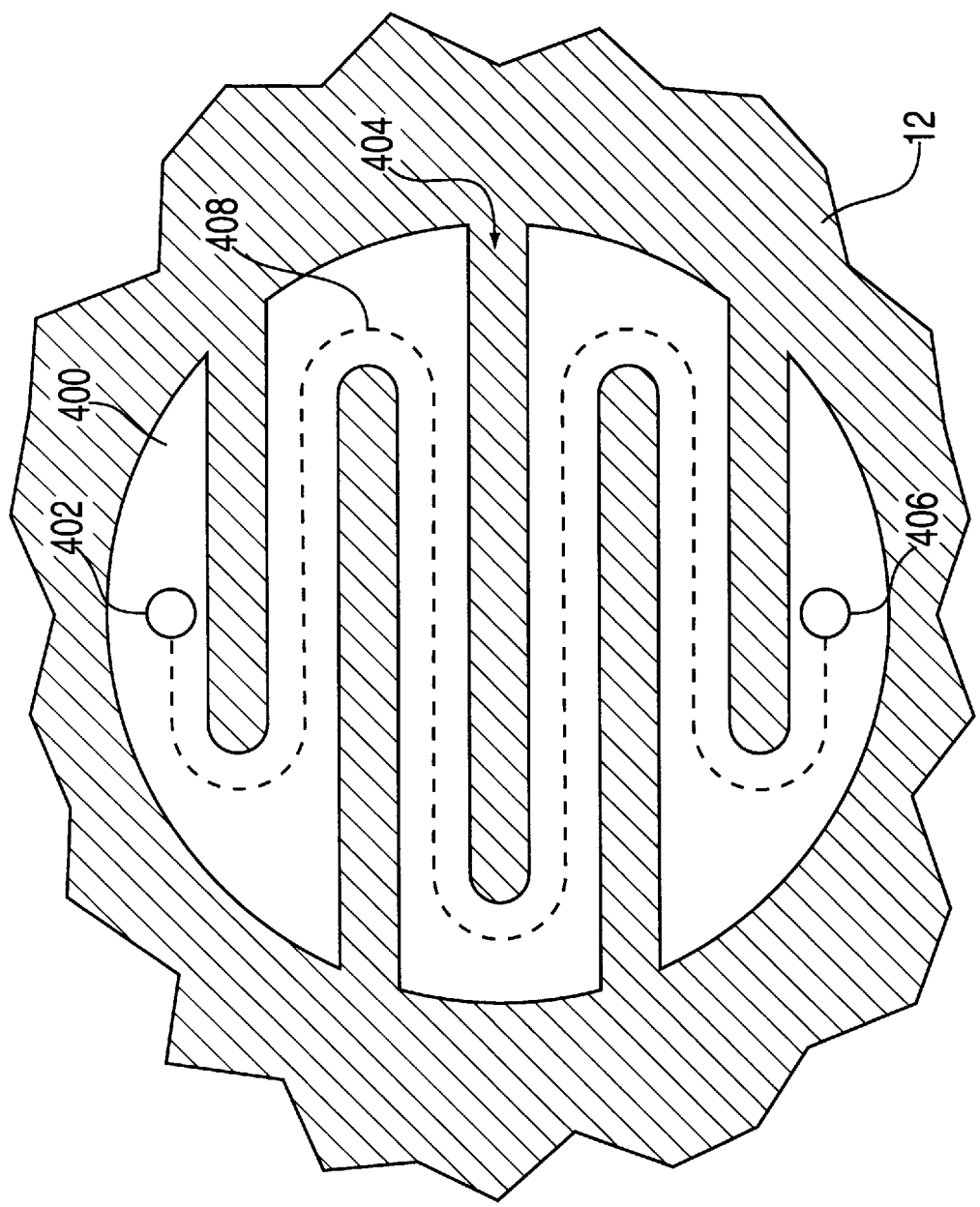
FIG. 7 depicts a horizontal cross-sectional view of an alternative electrode arrangement having a single electrode.

FIG. 7 depicts another alternative embodiment of the electrode structure of the present invention. In this embodiment, a single electrode 400 for a monopolar electrostatic chuck is depicted in a cutaway top plan view. A monopolar chuck uses a single electrode 400 that is biased with DC and RF voltages relative to a grounded wafer. The wafer is grounded either through use of a contact electrode providing a path from the wafer to ground or through use of a conductive plasma providing a path from the wafer to the grounded chamber walls. The single electrode 400 has a pair of feedthrough connectors 402 and 406 located proximate the edges of the electrode 400. The feedthroughs are spaced sufficiently apart to provide a conductive path there between to produce heat. As with the other electrodes, cut out portions 404 (shown in phantom) may be used to provide a serpentine current path 408 for the heating current. In this embodiment, the RF bias power is coupled to one feedthrough 402 or 406, the heating current supply is connected to both feedthroughs 402 and 406, and the chucking voltage supply is coupled to one or both feedthroughs 402 or 406.

In brief summary, it will be understood that with the use of as few as two electrodes, (for example, electrodes 14 and 16 of FIGS. 1 and 2), electrostatic chucking of a semiconductor wafer is accomplished, RF biasing of the chuck and wafer is accomplished, and heating of the chuck and wafer is accomplished. Although two electrodes are depicted, additional electrodes could be used to provide zonal chucking and zonal heating.

It will be understood by those skilled in the art that many variations and modifications may be made in the present invention without departing from the spirit and the scope thereof.

What is claimed is:

1. An electrostatic chuck comprising:
   a body of dielectric material;
   at least one electrode embedded in said body of dielectric material; and
   two feedthroughs connected to said at least one electrode for receiving DC voltage for electrostatic chucking, for receiving RF power for RF biasing of the chuck, and for receiving heating current for heating said electrostatic chuck.

2. The electrostatic chuck according to claim 1 wherein said at least one electrode comprises a pair of electrodes.

3. The electrostatic chuck according to claim 2 wherein said pair of electrodes comprises an inner circular electrode and an outer annular electrode concentric with and spaced from the inner electrode.

4. The electrostatic chuck according to claim 1 wherein the at least one electrode is a mesh electrode.

5. The electrostatic chuck according to claim 1 wherein said body of dielectric material and said at least one electrode and said feedthroughs have substantially the same coefficient of expansion.

6. The electrostatic chuck according to claim 5 wherein said body of dielectric material is aluminum-nitride and wherein said at least one electrode and said feedthroughs are molybdenum.

7. The electrostatic chuck according to claim 1 wherein said at least one electrode comprises a pair of electrodes, each electrode having two feedthroughs, said two feedthroughs connected to each electrode of said pair of electrodes includes a first pair of feedthroughs connected to one electrode of said pair of electrodes and a second pair of feedthroughs connected to the other electrode of said pair of electrodes, one feedthrough of each pair of feedthroughs for receiving the DC voltage for electrostatic chucking, one feedthrough of each pair of feedthroughs connected through a capacitor for receiving the RF power for RF biasing of the chuck, and at least one pair of said feedthroughs for receiving the heating current for heating said electrostatic chuck.

8. The electrostatic chuck according to claim 7 wherein each pair of said feedthroughs is for receiving AC heating current to provide dual heating of said electrostatic chuck.

9. The electrostatic chuck of claim 1 wherein said at least one electrode contains at least one cut out portion.

10. The electrostatic chuck of claim 9 wherein at least one cut out portion is a plurality of portions, where each portion alternately extends from an opposing side edge of said at least one electrode.

11. The electrostatic chuck of claim 1 wherein said at least one electrode is a pair of electrodes that are half-moon shaped, where each of the electrodes is connected to two feedthroughs.

12. The electrostatic chuck of claim 11 wherein said electrodes contain at least one cut out portion.

13. The electrostatic chuck of claim 11 wherein at least one cut out portion is a plurality of portions, where each portion alternatively extends from an opposing side edge of said electrode.

14. Combination electrostatic chuck apparatus, comprising:
   an electrostatic chuck including a body of ceramic material, first and second electrodes embedded in said body of ceramic material, a first pair of feedthroughs connected to said first electrode and a second pair of feedthroughs connected to said second electrode;
   a DC voltage supply connected to said first electrode through one feedthrough of said first pair of feedthroughs and to said second electrode through one feedthrough of said second pair of feedthroughs for electrostatic chucking of a semiconductor wafer to said body of ceramic material;
   a RF power supply connected to said first electrode through a first capacitor and through one feedthrough of said first pair of feedthroughs and to said second electrode through a second capacitor and through one feedthrough of said second pair of feedthroughs to couple RF power to said first electrode and said second electrode for RF biasing of said electrostatic chuck; and
   at least one heating current supply connected to said first pair of feedthroughs to connect RF heating current to said first electrode to heat said chuck.

15. The apparatus according to claim 14 wherein said apparatus includes a second heating current supply connected to said second pair of feedthroughs to connect heating current to the second electrode to provide dual zone heating of said electrostatic chuck.

16. The apparatus according to claim 14 wherein said first and second electrodes comprise an inner circular electrode and an outer annular electrode concentric with and spaced from the inner electrode.

17. The apparatus of claim 14 wherein the first and second electrodes is a mesh electrode.

18. The apparatus of claim 14 wherein said body of ceramic material and said first and second electrodes and said feedthroughs have substantially the same coefficient of expansion.

19. The apparatus of claim 14 wherein said body of ceramic material is aluminum-nitride and wherein said first and second electrodes and said feedthroughs are molybdenum.

20. The apparatus of claim 14 wherein said first and second electrodes contains at least one cut out portion.

21. The apparatus of claim 20 wherein at least one cut out portion is a plurality of portions, where each portion alternately extends from an opposing side edge of said first and second electrodes.

22. The apparatus of claim 14 wherein said first and second electrodes are half-moon shaped.

23. The apparatus of claim 22 wherein said half-moon shaped electrodes contain at least one cut out portion.

24. The apparatus of claim 23 wherein at least one cut out portion is a plurality of portions, where each portion alternatively extends from an opposing side edge of said electrodes.

* * * * *